(12) United States Patent
Seo et al.

(10) Patent No.: US 8,120,099 B2
(45) Date of Patent: Feb. 21, 2012

(54) SEMICONDUCTOR DEVICE WITH BURIED GATE AND METHOD FOR FABRICATING THE SAME

(75) Inventors: Dae-Young Seo, Gyeonggi-do (KR); Doo-Kang Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 71 days.

(21) Appl. No.: 12/616,609

(22) Filed: Nov. 11, 2009

(65) Prior Publication Data
US 2011/0001186 A1 Jan. 6, 2011

(30) Foreign Application Priority Data
Jul. 3, 2009 (KR) .................. 10-2009-0060638

(51) Int. Cl.
*H01L 29/78* (2006.01)
(52) U.S. Cl. ............... 257/330; 257/E29.262; 438/589; 438/270
(58) Field of Classification Search ............ 257/330, 257/332, E29.262; 438/270, 272, 589
See application file for complete search history.

(56) References Cited

U.S. PATENT DOCUMENTS

| 6,677,205 | B2 * | 1/2004 | Beintner | 438/270 |
| 7,163,894 | B2 * | 1/2007 | Nitta et al. | 438/687 |
| 2009/0140329 | A1 * | 6/2009 | Yoshimochi | 257/330 |

FOREIGN PATENT DOCUMENTS

| KR | 10-2008-0088095 | 2/2008 |
| KR | 1020080102775 | 11/2008 |

OTHER PUBLICATIONS

Notice of Preliminary Rejection issued from Korean Intellectual Property Office on Mar. 17, 2011.
Notice of Allowance issued by the Korean Intellectual Property Office on Dec. 28, 2011.

* cited by examiner

*Primary Examiner* — Victor A Mandala
*Assistant Examiner* — Scott Stowe
(74) *Attorney, Agent, or Firm* — IP & T Group LLP

(57) ABSTRACT

A semiconductor device and method for fabricating the same is provided. The semiconductor device includes a trench formed in a substrate, a junction region formed in the substrate on both sides of the trench, a first gate insulation layer formed on the surface of the trench, a first buried conductive layer formed over the first gate insulation layer to fill a portion of the trench, a second buried conductive layer formed between the first buried conductive layer and the first gate insulation layer to provide a gap between the first buried conductive layer and the first gate insulation layer, and a second gate insulation layer buried in the gap.

11 Claims, 4 Drawing Sheets

SEMICONDUCTOR DEVICE WITH BURIED GATE AND METHOD FOR FABRICATING THE SAME

CROSS-REFERENCE(S) TO RELATED APPLICATIONS

The present application claims priority of Korean Patent Application No(s). 10-2009-0060638, filed on Jul. 3, 2009, the disclosure of which is incorporated herein by reference in its entirety.

BACKGROUND OF THE INVENTION

The present invention relates to a method for fabricating a semiconductor device, and more particularly, to a semiconductor device with a buried gate and a method for fabricating the same.

As semiconductor devices such as DRAM shrink in size, it becomes more difficult to pattern a gate line and ensure a static capacitance (Cs). To solve the difficulty in patterning the gate line and ensuring the static capacitance (Cs), a buried gate structure has been intensively developed.

The buried gate structure has no problem in patterning the gate line and can ensure the static capacitance (Cs) because a parasitic capacitance between a gate line and a bit line is reduced.

FIG. 1 is a cross-sectional view of a conventional semiconductor device with a buried gate.

Referring to FIG. 1, an isolation layer 12 is formed in a semiconductor substrate 11, and a trench 15 having a certain depth is formed in the semiconductor substrate 11 by an etch process using a hard mask layer 14. A gate insulation layer 16 is formed on the surface of the trench 15. A buried gate 17 and 18 is formed on the gate insulation layer 16 to fill a portion of the trench 15. An interlayer insulation layer 19 is formed over the buried gate to fill the other portion of the trench 15. A junction region 13 is formed in the semiconductor substrate 11 on both sides of the trench 15.

To form the conventional buried gate illustrated in FIG. 1, a gate conductive layer is deposited until the trench is filled, and a chemical mechanical polishing (CMP) process and an etch-back process are sequentially performed.

According to the prior art, the gate conductive layer used as the buried gate is formed by stacking a titanium nitride (TiN) layer 17 and a tungsten (W) layer 18, instead of a polysilicon layer. Hence, the resistance of the buried gate is reduced.

However, since the titanium nitride (TiN) layer 17 has a high work function, an electric field increases in a cell structure of a DRAM implemented with NMOSFET. In particular, since the electric field further increases in the junction region 13 where a storage node contact hole and a bit line contact hole are met, a gate induced drain leakage (GIDL) characteristic is degraded.

SUMMARY OF THE INVENTION

Some embodiments are directed to providing a semiconductor device with a buried gate, which is capable of preventing degradation of a GIDL characteristic, and a method for fabricating the same.

Some embodiments are directed to provide a semiconductor device, the semiconductor device comprising a trench formed in a substrate, a junction region formed in the substrate on both sides of the trench, a first gate insulation layer formed on the surface of the trench, a first buried conductive layer formed over the first gate insulation layer to fill a portion of the trench, a second buried conductive layer formed between the first buried conductive layer and the first gate insulation layer to provide a gap between the first buried conductive layer and the first gate insulation layer, and a second gate insulation layer buried in the gap.

Some embodiments are directed to provide a method for fabricating a semiconductor device, the method comprising forming a junction region in a semiconductor substrate, etching the semiconductor substrate to form a trench, forming a first gate insulation layer on the surface of the trench, filling the trench by sequentially forming a first conductive layer and a second conductive layer over the first gate insulation layer, simultaneously etching the second conductive layer and the first conductive layer to form a buried gate filling a portion of the trench, partially etching the first conductive layer of the buried gate to form a gap, and forming a second gate insulation layer to fill the gap.

DESCRIPTION OF SPECIFIC EMBODIMENTS

Figure 1:
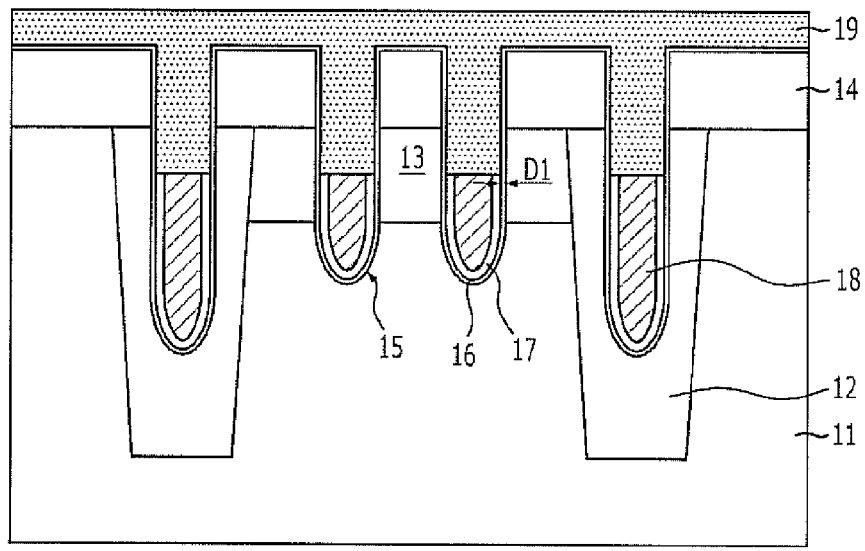
FIG. 1 is a cross-sectional view of a conventional semiconductor device with a buried gate.

Other objects and advantages of the present invention can be understood by the following description, and become apparent with reference to the embodiments of the present invention.

In the drawings, the illustrated thickness of layers and regions are exaggerated for clarity. When a first layer is referred to as being "on" a second layer or "on" a substrate, it could mean that the first layer is formed directly on the second layer or the substrate, or it could also mean that a third layer may exist between the first layer and the second layer or the substrate. Furthermore, the same or like reference numerals represent the same or like constituent elements, although they appear in different embodiments or drawings of the present invention.

Figure 2:
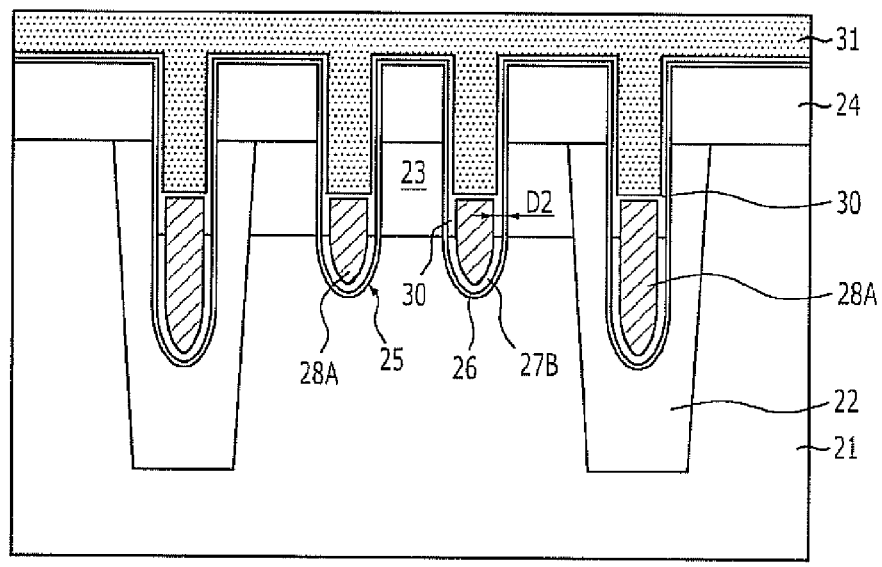
FIG. 2 is a cross-sectional view of a semiconductor device with a buried gate in accordance with an embodiment.

FIG. 2 is a cross-sectional view of a semiconductor device with a buried gate in accordance with an embodiment of the present invention.

Referring to FIG. 2, the semiconductor device includes a semiconductor substrate 21 with a trench 25, a first gate insulation layer 26 formed on the surface of the trench 25, a buried gate formed over the first gate insulation layer 26 to fill a portion of the trench 25, and an interlayer insulation layer 31 formed over the buried gate to fill the other portion of the trench 25. An isolation layer 22 is formed in the semiconductor substrate 21, and the trench 25 is formed in the isolation layer 22 as well as an active region. A junction region 23 is formed within the active region on both sides of the trench 25.

In addition, the buried gate has a bilayer structure of a titanium nitride pattern 27B and a tungsten pattern 28A, and a second gate insulation layer 30 is formed between the tungsten pattern 28A and the first gate insulation layer 26. That is, the second gate insulation layer 30 is formed over the titanium nitride pattern 27B. The surface height of the titanium nitride pattern 27B is lowered so that the second gate insulation layer 30 is formed between the tungsten pattern 28A and the first gate insulation layer 26. As will be described later in the fabricating method, the titanium nitride pattern 27B having the lowered surface height is formed by a wet etch process and thus a gap is formed. The gap is filled with the second gate insulation layer 30. The depth of the gap may be equal to or greater than that of the junction region 23. In other words, the gap may extend at least as deep into the semiconductor device, from the top of the trench 25, as the junction region 23.

In FIG. 2, the buried gate has a bilayer structure of the titanium nitride pattern 27B and the tungsten pattern 28A, and the gate insulation layer has a bilayer structure of the first gate insulation layer 26 and the second gate insulation layer 30. That is, the thickness D2 of the gate insulation layer is partially thick only adjacent to the junction region 23.

In particular, the second gate insulation layer 30 in the gate insulation layer is disposed between the tungsten pattern 28A and the first gate insulation layer 26. That is, since the second gate insulation layer 30 is disposed between the tungsten pattern 28A and the first gate insulation layer 26, with the absence of the titanium nitride pattern 27B, the thickness D2 of the gate insulation layer increases, thereby suppressing a GIDL phenomenon.

FIGS. 3A to 3F are cross-sectional views illustrating a method for fabricating a semiconductor device with a buried gate in accordance with an embodiment of the present invention.

Figure 3A:
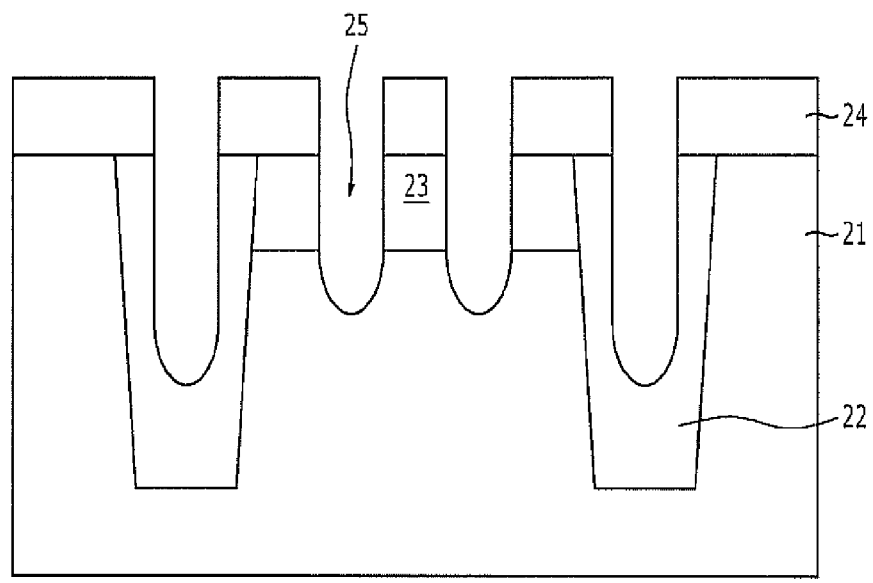
FIGS. 3A to 3F are cross-sectional views illustrating a method for fabricating a semiconductor device with a buried gate in accordance with an embodiment.

Referring to FIG. 3A, an isolation layer 22 is formed in a semiconductor substrate 21 by a shallow trench isolation (STI) process. In this case, the isolation layer 22 may include an oxide layer such as a high-density plasma (HDP) oxide layer or a spin-on dielectric (SOD) layer.

A junction region 23 is formed by an ion implantation process. Alternatively, the contact region 23 may be formed after forming a buried gate (not shown).

A trench 25 where a buried gate will be formed is formed by an etch process using a hard mask layer 24 as an etch barrier. The trench 25 may be formed by etching the isolation layer 22 as well as the semiconductor substrate 21 where the junction region 23 is formed. Since the gate generally has a line type, the trench 25 also has a line type. The line-type trench 25 is formed across both the semiconductor substrate 21 and the isolation layer 22. In this case, since an etch selectivity between the semiconductor substrate 21 and the isolation layer 22 is different, the isolation layer 22 is further etched. Thus, the trench 25 in the isolation layer 22 may be deeper. For example, the depth of the trench formed in the semiconductor substrate 21 is in a range of approximately 1,000 Å to approximately 1,500 Å, and the depth of the trench formed in the isolation layer 22 is in a range of approximately 1,500 Å to approximately 2,000 Å.

The etch process for forming the trench 25 uses the hard mask layer 24 as the etch barrier. The hard mask layer 24 is patterned by a photoresist pattern (not shown). The hard mask layer 24 may be formed of a material having a high etch selectivity in the etching of the semiconductor substrate 21. For example, the hard mask layer 24 has a stacked structure of an oxide layer and a nitride layer. In this case, the thickness of the oxide layer is in a range of approximately 30 Å to approximately 100 Å, and the thickness of the nitride layer is in a range of approximately 100 Å to approximately 500 Å.

The trench 25 is formed deeper than the junction region 23.

In the case where the hard mask layer 24 is applied, the photoresist pattern may be stripped after forming the trench 25. For convenience's sake, the substrate where the isolation layer 22, the junction region 23, and the trench 25 are formed is represented by the substrate 21.

Figure 3B:
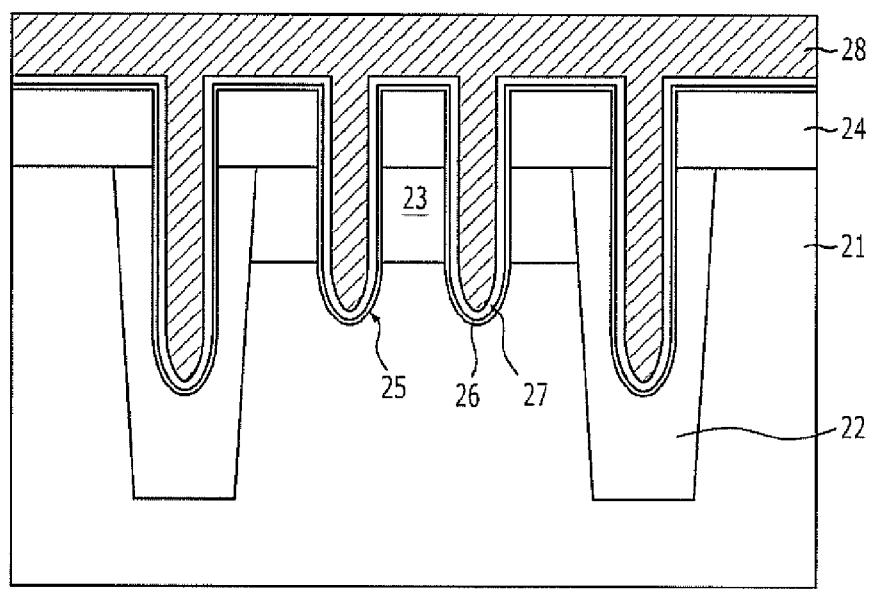

Referring to FIG. 3B, a first gate insulation layer 26 is formed on the sidewall and bottom of the trench 25. The first gate insulation layer 26 may be formed by oxidizing the surface of the trench 25. In a substantially similar manner to a typical process of forming a gate insulation layer, the surface of the trench 25 may be oxidized by a thermal oxidation process. A silicon oxide layer is formed by an oxidation process. Since the semiconductor substrate 21 is a silicon substrate, a silicon oxide ($Si_xO_y$) layer is formed by an oxidation process. Alternatively, the first gate insulation layer 26 may be formed by a deposition process.

A titanium nitride layer 27 and a tungsten layer 28 are sequentially formed over the first gate insulation layer 26 to thereby fill the trench 25. The titanium nitride layer 27 is deposited thinly along a profile of the lower structure, and the tungsten layer 28 is deposited on the titanium nitride layer 27 until the trench 25 is completely filled.

Figure 3C:
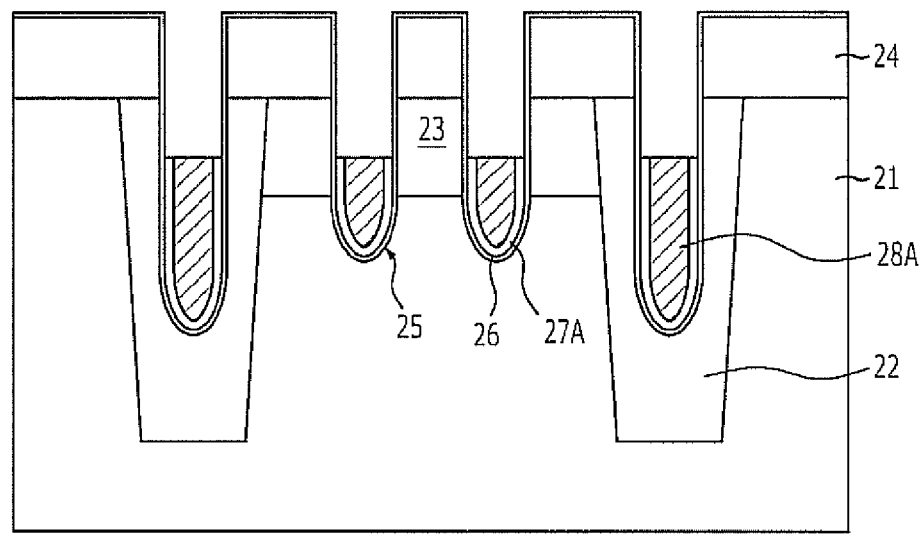

Referring to FIG. 3C, a process of separating a buried gate is carried out. That is, a planarization process such as chemical mechanical polishing (CMP) is carried out until the surface of the first gate insulation layer 26 over the hard mask layer 24 is exposed, and an etch-back process is carried out. Consequently, a titanium nitride pattern 27A and a tungsten pattern 28A remain to fill a portion of the trench 25.

By sequentially forming the titanium nitride pattern 27A and the tungsten pattern 28A, the formation of a buried gate is completed. That is, the buried gate has a bilayer structure of the titanium nitride pattern 27A and the tungsten pattern 28A and fills a portion of the trench 25.

Due to the use of the titanium nitride pattern 27A in the buried gate, a work function value determining a cell threshold voltage can be stably maintained. Furthermore, the tungsten pattern 28A reduces the resistance of the buried gate, thereby increasing the operating speed of the semiconductor device. Consequently, the titanium nitride pattern 27A is used as a gate electrode for driving a transistor, and the tungsten pattern 28A is used to reduce the resistance of the buried gate.

In the buried gate structure, the titanium nitride pattern 27A causes the degradation of the GIDL characteristic because an electric field increases in the junction region 23 where the storage node contact hole and the bit line contact hole are met.

For this reason, the titanium nitride pattern 27A adjacent to the junction region 23 is partially removed.

Figure 3D:
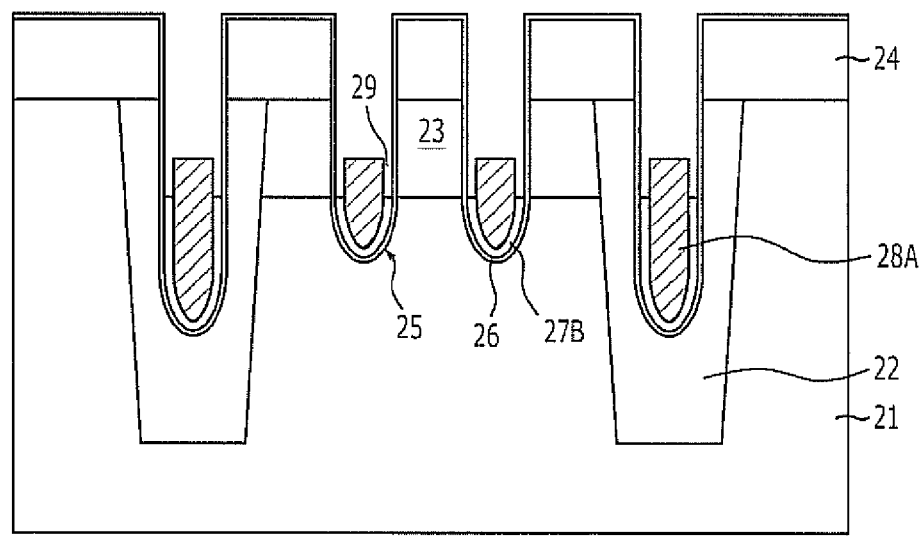

Referring to FIG. 3D, an upper portion of the titanium nitride pattern 27A is partially removed to form a gap 29 between the tungsten layer 28A and the first gate insulation layer 26. Accordingly, the titanium nitride pattern 27B having the lowered height is formed. The lowered height corresponds to a contact depth with respect to the junction region 23. That is, the depth of the gap 29 may be equal to or greater than the depth of the junction region 23.

A wet etch process is performed for selectively removing only the titanium nitride pattern 27B. For example, the wet etch process may be performed using a mixed aqueous solution of sulfuric acid ($H_2SO_4$) and hydrogen peroxide ($H_2O_2$).

Figure 3E:
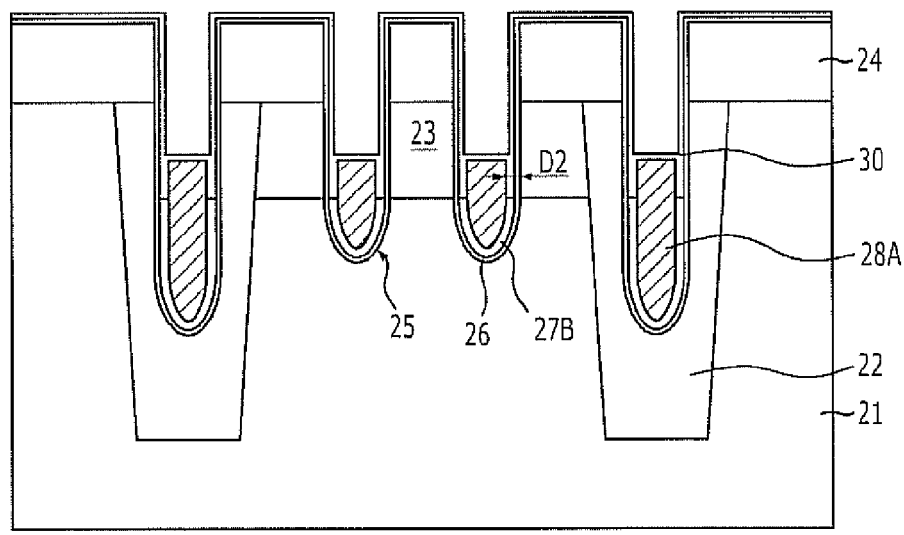

Referring to FIG. 3E, the gap 29 is filled by forming a second gate insulation layer 30 over a resulting structure. By forming the second gate insulation layer 30, the bilayered gate insulation layer is disposed between the junction region 23 and the tungsten pattern 28A. That is, the bilayered gate insulation layer including the first gate insulation layer 26 and the second gate insulation layer 30 is disposed. Due to the bilayered gate insulation layer, the gate insulation layer having a large thickness D2 is formed between the tungsten pattern 28A and the junction region 23. The thickness D2 of the gate insulation layer is larger than the thickness D1 of the conventional gate insulation layer illustrated in FIG. 1.

As such, the bilayer structure increases the thickness of the gate insulation layer, thereby preventing the GIDL phenomenon.

Figure 3F:
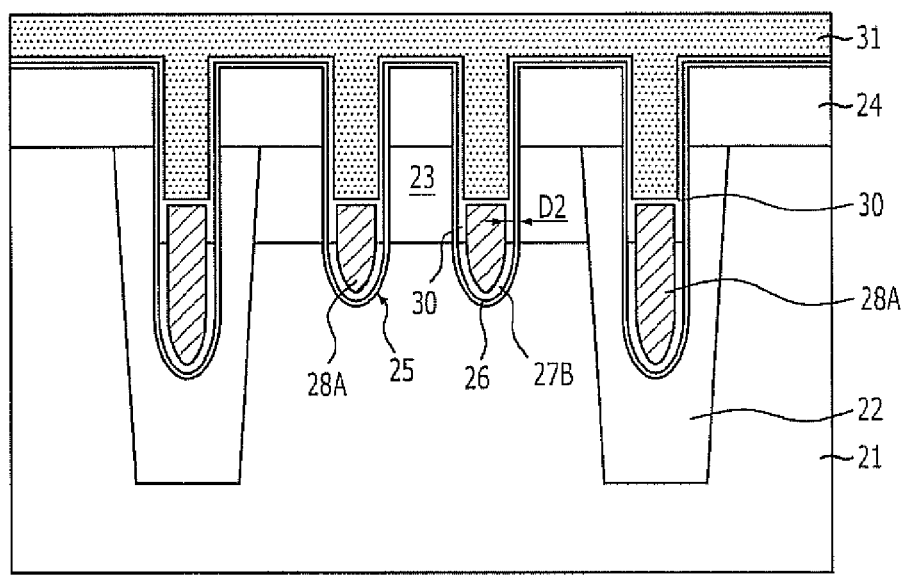

Referring to FIG. 3F, an interlayer insulation layer 31 is formed over a resulting structure. The interlayer insulation layer 31 includes an oxide layer having an excellent gap-fill characteristic. For example, the interlayer insulation layer 31 is formed of a polysilazane-based spin-on dielectric (SOD). Moreover, the interlayer insulation layer 31 may gap-fill the oxide layer after a nitride layer is sealed thinly.

In accordance with the embodiments of the present invention, the buried gate has a bilayer structure of the titanium nitride pattern and the tungsten pattern, and the gate insulation has a bilayer structure of the first gate insulation layer and the second gate insulation layer. Hence, the gate insulation layer is partially thick only around the junction region, thereby preventing the GIDL phenomenon.

In particular, since the second gate insulation layer is disposed between the tungsten pattern and the first gate insulation layer, without the titanium nitride pattern, the thickness of the gate insulation layer increases, thereby further preventing the GIDL phenomenon.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
   a trench formed in a substrate;
   a junction region formed in the substrate on both sides of the trench;
   a first gate insulation layer formed on the surface of the trench;
   a first buried conductive layer formed over the first gate insulation layer to fill a lower portion of the trench;
   a second buried conductive layer formed between the first buried conductive layer and the first gate insulation layer to provide a gap between the first buried conductive layer and the first gate insulation layer; and
   a second gate insulation layer formed over the first gate insulation layer and the first buried conductive layer, the second gate insulation layer being buried in the gap.

2. The semiconductor device of claim 1, wherein the first buried conductive layer comprises a tungsten layer, and the second buried conductive layer comprises a titanium nitride layer.

3. The semiconductor device of claim 1, wherein the first gate insulation layer and the second gate insulation layer comprise a silicon oxide layer.

4. The semiconductor device of claim 1, wherein the depth of the gap is substantially identical to the depth of at least the junction region.

5. A method for fabricating a semiconductor device, the method comprising:
   providing a semiconductor substrate;
   etching the semiconductor substrate to form a trench;
   forming a first gate insulation layer on the surface of the trench;
   filling the trench by sequentially forming a first conductive layer and a second conductive layer over the first gate insulation layer;
   simultaneously etching the second conductive layer and the first conductive layer to form a buried gate filling a lower portion of the trench;
   partially etching the first conductive layer of the buried gate to form a gap; and
   forming a second gate insulation layer over the first gate insulation layer and the second conductive layer to fill the gap.

6. The method of claim 5, wherein the first conductive layer comprises a titanium nitride layer, and the second conductive layer comprises a tungsten layer.

7. The method of claim 6, wherein, in forming the gap, the titanium nitride layer is selectively etched using a wet etch process.

8. The method of claim 7, wherein the wet etch process is performed using a mixed aqueous solution of sulfuric acid ($H_2SO_4$) and hydrogen peroxide ($H_2O_2$).

9. The method of claim 5, the method further comprises forming a junction region in the semiconductor substrate before forming the trench.

10. The method of claim 9, wherein the depth of the gap is substantially identical to the depth of at least the junction region.

11. The method of claim 5, wherein the first gate insulation layer and the second gate insulation layer comprise a silicon oxide layer.

* * * * *

UNITED STATES PATENT AND TRADEMARK OFFICE
CERTIFICATE OF CORRECTION

PATENT NO. : 8,120,099 B2
APPLICATION NO. : 12/616609
DATED : February 21, 2012
INVENTOR(S) : Dae-Young Seo et al.

Page 1 of 1

It is certified that error appears in the above-identified patent and that said Letters Patent is hereby corrected as shown below:

Title Page, FOREIGN PATENT DOCUMENTS portion of section (56) for References Cited:

Change "KR    10-2008-0088095    2/2008"

to

--KR    10-2008-0088095    10/2008--

Signed and Sealed this
Twenty-seventh Day of March, 2012

David J. Kappos
*Director of the United States Patent and Trademark Office*